United States Patent
Yu et al.

(10) Patent No.: US 10,274,830 B2
(45) Date of Patent: Apr. 30, 2019

(54) METHOD AND APPARATUS FOR DYNAMIC LITHOGRAPHIC EXPOSURE

(71) Applicant: Taiwan Semiconductor Manufacturing Co., Ltd., Hsin-Chu (TW)

(72) Inventors: Jun-Yih Yu, New Taipei (TW); De-Fang Huang, Hsin-Chu (TW); De-Chen Tseng, New Taipei (TW); Jia-Feng Chang, Taichung (TW); Li-Fang Hsu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 60 days.

(21) Appl. No.: 15/400,015

(22) Filed: Jan. 6, 2017

(65) Prior Publication Data
US 2017/0212423 A1    Jul. 27, 2017

Related U.S. Application Data

(60) Provisional application No. 62/287,591, filed on Jan. 27, 2016.

(51) Int. Cl.
*G03F 7/20*    (2006.01)
(52) U.S. Cl.
CPC ................... *G03F 7/70333* (2013.01)
(58) Field of Classification Search
CPC .................................................. G03F 7/70333
USPC .......................................................... 430/30
See application file for complete search history.

(56) References Cited

U.S. PATENT DOCUMENTS

| | | | |
|---|---|---|---|
| 4,869,999 A | 9/1989 | Fukuda et al. | |
| 4,904,569 A | 2/1990 | Fukuda et al. | |
| 5,255,050 A | 10/1993 | Kitagawn | |
| 5,303,002 A | 4/1994 | Yan | |
| 6,057,970 A | 5/2000 | Kim et al. | |
| 6,304,316 B1 | 10/2001 | Jain et al. | |
| 6,829,040 B1 | 12/2004 | Kye et al. | |
| 7,709,187 B2 | 5/2010 | Patel et al. | |
| 2006/0007554 A1 | 1/2006 | Ferber et al. | |
| 2014/0053399 A1* | 2/2014 | Askebjer | H05K 3/0017 29/846 |

FOREIGN PATENT DOCUMENTS

| JP | H02137217 A | 5/1990 |
|---|---|---|
| JP | 2008003502 A | 1/2008 |

OTHER PUBLICATIONS

Srikanth, D. "Optical Projection Lithography." 8thIndo-German Winter Academy (2009).
Mack, Chris A. "Field Guide to Optical Lithography." eISBN: 9780819478214, published in 2006, pp. 71-77.

* cited by examiner

*Primary Examiner* — Christopher G Young
(74) *Attorney, Agent, or Firm* — Eschweiler & Potashnik, LLC (57) ABSTRACT

The present disclosure relates to a dynamic lithographic exposure method, and an associated apparatus, which exposes a photosensitive material over a plurality of depths of focus respectively spanning a different region of the photosensitive material. By exposing the photosensitive material over a plurality of depths of focus, the exposure of the photosensitive material is improved resulting in a larger lithographic process window. In some embodiments, the dynamic lithographic exposure method is performed by forming a photosensitive material over a substrate. The photosensitive material is exposed to electromagnetic radiation at a plurality of depths of focus that respectively span a different region within the photosensitive material. Exposing the photosensitive material to the electromagnetic radiation modifies a solubility of an exposed region within the photosensitive material. The photosensitive material is then developed to remove the soluble region.

20 Claims, 6 Drawing Sheets

METHOD AND APPARATUS FOR DYNAMIC LITHOGRAPHIC EXPOSURE

REFERENCE TO RELATED APPLICATION

This Application claims priority to U.S. Provisional Application No. 62/287,591 filed on Jan. 27, 2016, the contents of which is hereby incorporated by reference in its entirety.

BACKGROUND

Integrated chips are fabricated in semiconductor fabrication facilities or fabs. Fabs contain processing tools that are configured to perform processing steps (e.g., etching steps, photolithography steps, deposition steps, etc.) upon a semiconductor substrate (e.g., a silicon wafer). Photolithography is a commonly used fabrication process by which a photomask having a pattern is irradiated with electromagnetic radiation to transfer the pattern onto a photosensitive material overlying a substrate. Selective parts of the substrate may be subsequently processed according to the patterned photosensitive material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Over the history of the semiconductor industry, the minimum features sizes of components within an integrated chip have generally decreased. Smaller minimum features sizes have largely been achieved by improving a resolution of photolithography tools used to print such features. However, as the resolution of a photolithography tool improves the depth of focus of the electromagnetic radiation generated by the photolithography tool focus decreases. It has been appreciated that as the depth of focus decreases, a process window of a photolithography tool shrinks. If the exposure of a photoresist layer goes outside of the process window of a photolithography tool, sections of the photoresist layer may not be sufficiently exposed and a corresponding feature may not be properly printed. This can lead to yield lost and/or integrated chip failure.

The present disclosure relates to a dynamic lithographic exposure method, and an associated apparatus, which changes a focus (e.g., a location of an image plane, a location of a depth of focus, etc.) of electromagnetic radiation during exposure of a photosensitive material. Changing the focus of the electromagnetic radiation during the exposure causes the electromagnetic radiation to have a plurality of different depths of focus respectively spanning different regions of the photosensitive material. The different depths of focus collectively expose the photosensitive material according to a cumulative depth of focus that is larger than the individual different depths of focus, and therefore results in a larger lithographic process window that improves exposure of the photosensitive material.

Figure 1:
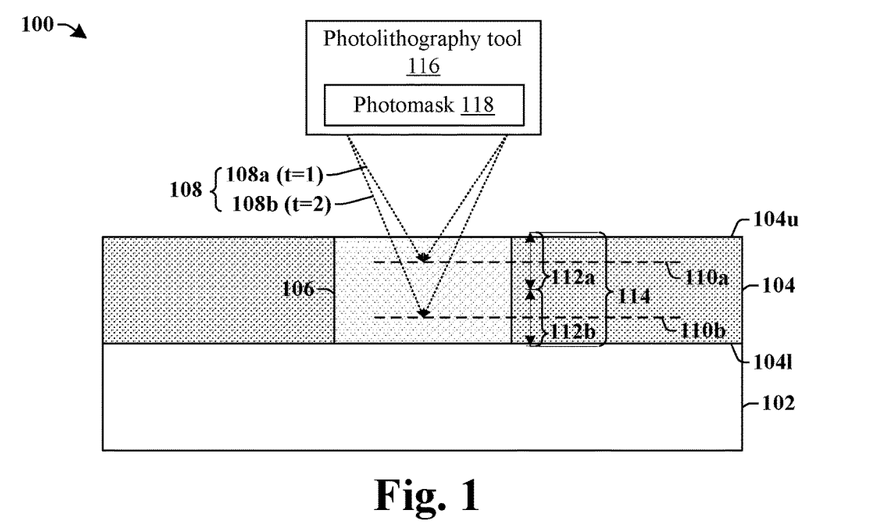
FIG. 1 illustrates a cross-sectional view of some embodiments of a method of dynamically exposing a photosensitive material over a plurality of depths of focus respectively spanning a different region of the photosensitive material.

FIG. 1 illustrates some embodiments of a cross-sectional view 100 showing a method of dynamically exposing a photosensitive material over a plurality of depths of focus respectively spanning a different region of the photosensitive material.

As shown in cross-sectional view 100, a photosensitive material 104 (e.g., a photoresist) is formed over a substrate 102. The photosensitive material 104 is selectively exposed to electromagnetic radiation 108 generated by a photolithography tool 116 to modify a solubility of an exposed region and define a soluble region 106 having a pattern corresponding to a photomask 118. During the exposure, the electromagnetic radiation 108 is dynamically focused along a plurality of different paths 108a-108b respectively corresponding to image planes 110a-110b (i.e., planes along which an image is projected) located at different vertical positions.

For example, at a first time (t=1) the photolithography tool 116 may focus electromagnetic radiation 108 along a first path 108a corresponding to a first image plane 110a located at a first depth below an upper surface 104u of the photosensitive material 104. At a subsequent second time (t=2), the photolithography tool 116 may focus electromagnetic radiation 108 along a second path 108b corresponding to a second image plane 110b located at a second depth below the upper surface 104u of the photosensitive material 104. In some embodiments, images formed on the first image plane 110a and the second image plane 110b may be offset in a vertical direction and substantially aligned along a lateral direction (extending parallel to an upper surface of the photosensitive material 104). In some embodiments, the photolithography tool 116 may focus the electromagnetic radiation 108 in a manner that monotonically increases a depth of an image plane within the photosensitive material 104 (e.g., so that the depth of the image plane gets larger as time progresses).

The plurality of image planes 110a-110b have different depths of focus 112a-112b (i.e., a distance extending in opposite directions from an image plane within which a projected image has acceptable optical properties, such as focus, dose, etc., to expose the photosensitive material 104). The different depths of focus 112a-112c respectively span a different region within the photosensitive material 104. For example, the first image plane 110a has a first depth of focus 112a extending from the upper surface 104u of the photosensitive material 104 to a first position within the photosensitive material 104. The second image plane 110b has a second depth of focus 112b extending from the first position within the photosensitive material 104 to a second position within the photosensitive material 104.

In some embodiments, the plurality of depths of focus 112a-112b may continuously extend between the upper surface 104u of the photosensitive material 104 and a lower surface 104l of the photosensitive material 104. For example, the plurality of depths of focus 112a-112b may be contiguous along a vertical direction that is normal to an upper surface of the photosensitive material 104. Alternatively, the plurality of depths of focus 112a-112b may overlap one another along the vertical direction.

Dynamically focusing the electromagnetic radiation 108 over the plurality of different image planes 110a-110b spreads the electromagnetic radiation 108 over a cumulative depth of focus 114 that is larger than the individual different depths of focus 112a-112b respectively associated with the different image planes 110a-110b. Since a depth of focus defines a location within which a projected image has acceptable optical properties (e.g., focus, dose, etc.) to expose the photosensitive material 104, the cumulative depth of focus 114 provides the photolithography tool 116 with a larger process window. For example, in some embodiments the process window of the photolithography tool 116 may be increased by over 30% with respect to fixed depths of focus (e.g., the cumulative depth of focus of the electromagnetic radiation 108 may increase from approximately 0.2 um to approximately 0.3 um). Furthermore, by using a dynamic exposure method, a lifetime of the photolithography tool 116 can be prolong since the dynamic exposure can compensate for decay of optical elements (e.g., lenses and/or mirrors) with an optical train of the photolithography tool 116.

Figure 2:
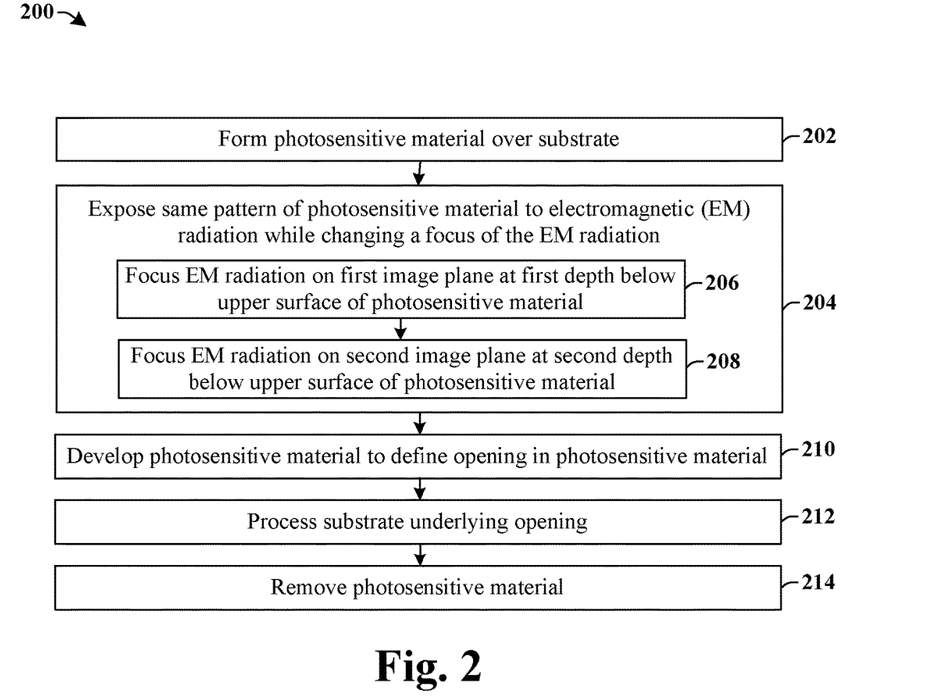
FIG. 2 illustrates a flow diagram of some embodiments of a method of dynamically exposing a photosensitive material over a plurality of depths of focus respectively spanning a different region of the photosensitive material.

FIG. 2 illustrates a flow diagram of some embodiments of a method 200 of dynamically exposing a photosensitive material over a plurality of depths of focus respectively spanning a different region of the photosensitive material.

While method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 3:
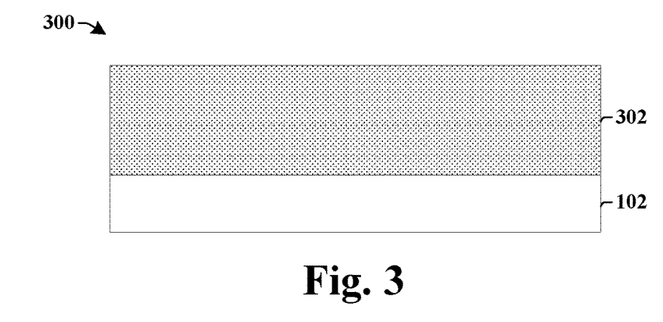
FIGS. 3-6 illustrate cross-sectional views of some embodiments of a method of dynamically exposing a photosensitive material over a plurality of depths of focus.

At 202, a photosensitive material is formed over a substrate. In some embodiments, the photosensitive material may comprise a positive or negative photoresist. FIG. 3 illustrates some embodiments of a cross-sectional view 300 corresponding to act 202.

At 204, a pattern within the photosensitive material is exposed to electromagnetic radiation while changing a focus of the electromagnetic radiation. Exposing the photosensitive material to electromagnetic radiation modifies a solubility of an exposed region to define a soluble region within the photosensitive material. In some embodiments, act 204 may be performed according to acts 206-208.

At 206, the electromagnetic radiation is focused on a first image plane located at a first depth below an upper surface of the photosensitive material. The first image plane has a first depth of focus spanning a first region within the photosensitive material.

At 208, the electromagnetic radiation is focused on a second image plane located at a second depth below the upper surface of the photosensitive material. The second image plane has a second depth of focus spanning a second region within the photosensitive material.

Changing the focus of the electromagnetic radiation changes a location of an image plane of the electromagnetic radiation and therefore also changes a location of a depth of focus of the electromagnetic radiation. Changing the depth of focus of the electromagnetic radiation results in the electromagnetic radiation being provided over a plurality of depths of focus respectively spanning a different region of the photosensitive material. The changes in focus are generally performed in-situ (i.e., without breaking a vacuum of a processing chamber in which the exposure process is performed). FIGS. 4A-4D illustrate some embodiments of cross-sectional views corresponding to act 204.

Figure 5:
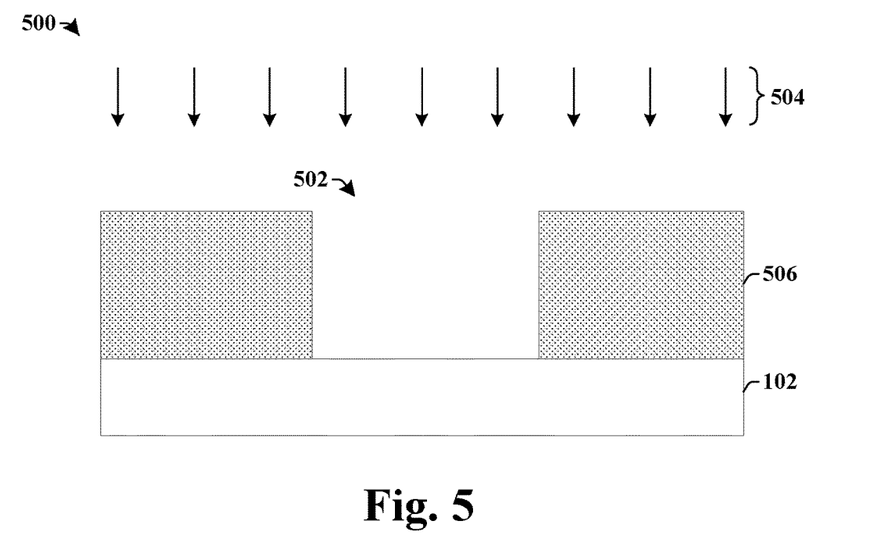

At 210, the photosensitive material is developed to remove the soluble region and to define an opening within the photosensitive material. FIG. 5 illustrates some embodiments of a cross-sectional view 500 corresponding to act 210.

Figure 6:
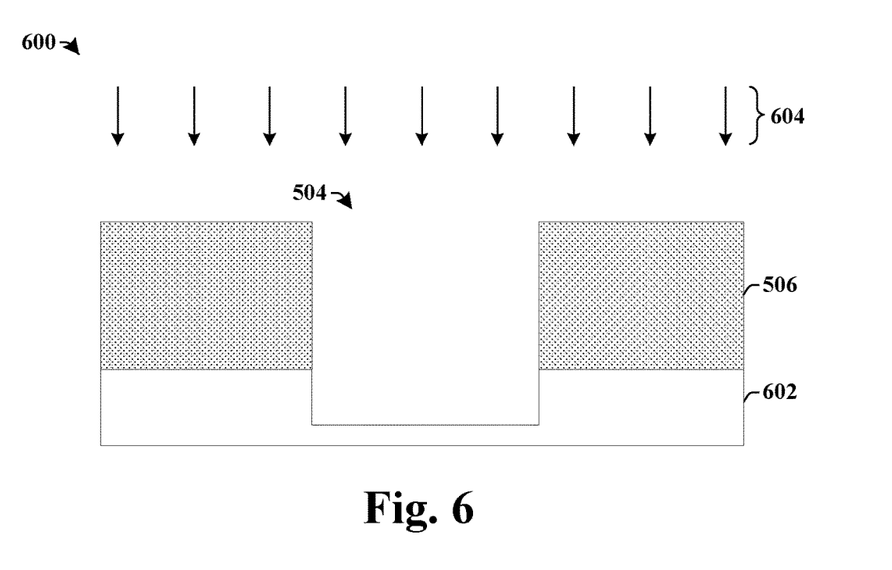

At 212, the substrate underlying the opening may be processed, in some embodiments. FIG. 6 illustrates some embodiments of a cross-sectional view 600 corresponding to act 212.

At 214, the photosensitive material is removed from over the substrate.

It will be appreciated that the method 200 may be performed iteratively to form successive layers of photosensitive material over a substrate. The successive layers of photosensitive material may comprise different patterns. For example, in some embodiments, after a first layer of photosensitive material is removed (e.g., according act 214), a second layer of photosensitive material may be formed over the substrate (e.g., according to act 202). A second pattern may be exposed within the second layer of photosensitive material while changing a focus of the electromagnetic radiation, thereby exposing the second layer of photosensitive material to electromagnetic radiation at a plurality of different depths of focus that respectively span a different region within the second layer of photosensitive material (e.g., according to act 204). The second layer of photosensitive material may be subsequently developed to define an opening within the second layer of photosensitive material (e.g., according to act 210).

FIGS. 3-6 illustrate cross-sectional views of some embodiments of a dynamic lithographic exposure method that exposes a photosensitive material over a plurality of depths of focus.

As shown in cross-sectional view 300 of FIG. 3, a photosensitive material 302 is formed over a substrate 102. In various embodiments, the substrate 102 may comprise any type of semiconductor body (e.g., silicon/CMOS bulk, SiGe, SOI, etc.) such as a semiconductor wafer or one or more die on a wafer, as well as any other type epitaxial layers, dielectric layers, and/or metal interconnect layers formed thereon and/or otherwise associated therewith. The photosensitive material 302 is a material having chemical properties that change when exposed to electromagnetic radiation (e.g., molecular chains of a photosensitive material may become cross-linked when exposed to electromagnetic radiation). In various embodiments, the photosensitive material 302 may comprise a photosensitive polymer such as a positive or negative photoresist.

In some embodiments, the photosensitive material 302 may be formed onto the substrate 102 by a spin coating process. The spin coating process deposits the photosensitive material 302 onto the substrate 102 as a liquid and then subsequently spins the substrate 102 at a high rate of RPMs (e.g., between 1,000 and 10,000 RPM) to give the layer of photosensitive material 302 a uniform thickness. In other embodiments, the photosensitive material 302 may be formed onto the substrate 102 by other processes (e.g., by vapor deposition processes).

FIGS. 4A-4D illustrate cross-sectional views showing a dynamic exposure of the photosensitive material 302 to electromagnetic radiation over a plurality of depths of focus. The dynamic exposure of the photosensitive material 302 causes segments of photosensitive material 302 to achieve different solubilities to a chemical developer. Although FIGS. 4A-4D illustrates an embodiments wherein an exposed region of the photosensitive material 302 becomes soluble (e.g., as with a positive photoresist), it will be appreciated that the disclosure is not limited to such embodiments. Rather, in other embodiments the exposed region of the photosensitve material 302 may become insoluble while unexposed regions of the photosensitve material 302 may remain soluble (e.g., as with a negative photoresist).

Figure 4A:
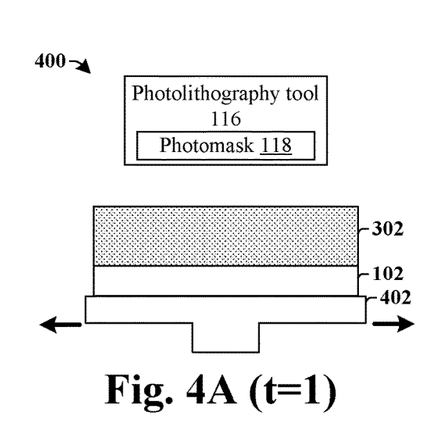

As shown in cross-sectional view 400 of FIG. 4A, at a first time (t=1) a photomask 118 is aligned with the substrate 102. In some embodiments, alignment may be performed by moving a wafer stage 402 (e.g., a vacuum wafer chuck) holding the substrate 102 to align alignment marks on the photomask 118 with alignment marks on and/or within the substrate 102.

Figure 4B:
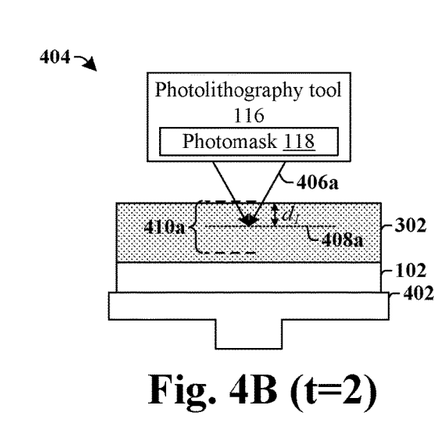

As shown in cross-sectional view 404 of FIG. 4B, once alignment is completed electromagnetic radiation from a photolithography tool 116 is selectively provided to the photosensitive material 302 according to a pattern defined by the photomask 118. At a second time (t=2), the electromagnetic radiation is focused along a first set of paths 406a that converge along a first image plane 408a. In some embodiments, the first image plane 408a may be located at a first depth $d_1$ below an upper surface of the photosensitive material 302. In other embodiments, the first image plane 408a may be located at or above the upper surface of the photosensitive material 302. The first image plane 408a provides the electromagnetic radiation with a first depth of focus 410a spanning a first region within the photosensitive material 302.

Figure 4C:
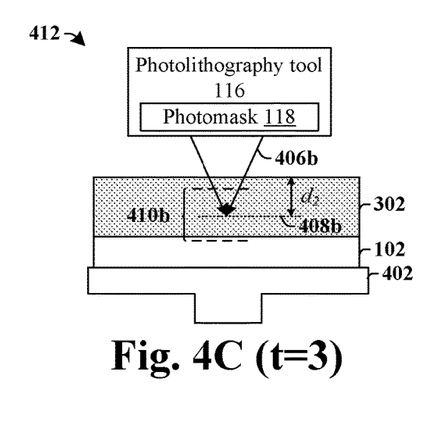

As shown in cross-sectional view 412 of FIG. 4C, a focus of the electromagnetic radiation is changed at a third time (t=3). The change in focus causes the electromagnetic radiation to be selectively provided to the photosensitive material 302 (according to the pattern defined by the photomask 118) along a second set of paths 406b that converge along a second image plane 408b. The second image plane 408b is located at a second depth $d_2$ below the upper surface of the photosensitive material 302, wherein the second depth $d_2$ is greater than the first depth $d_1$. The second image plane 408b provides the electromagnetic radiation with a second depth of focus 410b spanning a second region within the photosensitive material 302. In various embodiments, the first depth of focus 410a may be contiguous with or overlap the second depth of focus 410b. In some embodiments, because the electromagnetic radiation is focused on a same pattern during the second time (t=2) and the third time (t=3), no alignment is performed between the second time (t=2) and the third time (t=3).

Figure 4D:
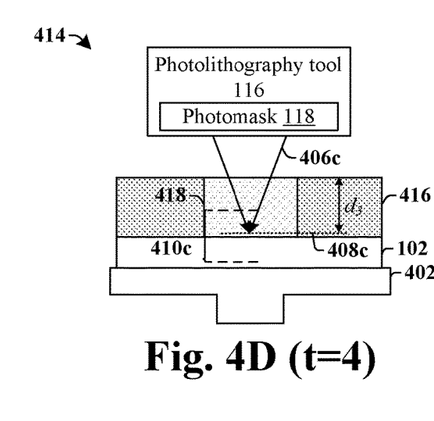

As shown in cross-sectional view 414 of FIG. 4D, a focus of the electromagnetic radiation is changed at a fourth time (t=4). The change in focus causes the electromagnetic radiation to be selectively provided to the photosensitive material 302 (according to the pattern defined by the photomask 118) along a third set of paths 406c that converge along a third image plane 408c. The third image plane 408c is located at a third depth $d_3$ below the upper surface of the photosensitive material 302, wherein the third depth $d_3$ is greater than the second depth $d_2$. In various embodiments, the third image plane 408c may be within the photosensitive material 302 or below a lower surface of the photosensitive material 302. The third image plane 408c provides the electromagnetic radiation with a third depth of focus 410c spanning a third region within the layer of photosensitive material 302. In some embodiments, the third depth of focus 410c may be contiguous with or overlap the second depth of focus 410b.

The exposure of the photosensitive material 302 to the electromagnetic radiation changes chemical properties of the photosensitive material 302 within an exposed region 418. The change in chemical properties results in the exposed region 418 having a different solubility than unexposed regions 416 of the photosensitive material. In some embodiments, the photosensitive material 302 may be continuously exposed to the electromagnetic radiation according to the pattern defined by the photomask 118 while dynamically changing a depth of focus of the electromagnetic radiation. In other embodiments, the photosensitive material 302 may be discretely exposed to the electromagnetic radiation according to the pattern defined by the photomask 118 while changing a depth of focus of the electromagnetic radiation (e.g., the photosensitive material 302 may be exposed to discrete bursts of electromagnetic radiation between changing a depth of focus of the electromagnetic radiation).

As shown in cross-sectional view 500 of FIG. 5, the photosensitive material 506 is developed to remove a soluble region and define an opening 502 within the photosensitive material 506. The photosensitive material 506 may be developed by exposing the photosensitive material 506 to a chemical developer 504. In some embodiments, the chemical developer 504 removes the exposed region (418 of FIG. 4D) of the photosensitive material, while the unexposed regions (416 of FIG. 4D) remain over the substrate 102. In other embodiments, the chemical developer 504 may remove unexposed regions (416 of FIG. 4D) of the photosensitive material, while the exposed region (418 of FIG. 4D) remains over the substrate 102. In some embodiments, the chemical developer 504 may comprise tetramethylammonium hydroxide (TMAH). In other embodiments, the chemical developer 504 may comprise potassium hydroxide (KOH), sodium hydroxide (NaOH), acetate, ethyl lactate, or diacetone alcohol, for example.

As shown in cross-sectional view 600, the substrate 602 is processed according to the patterned photosensitive material 506. In some embodiments, the substrate 602 may be selectively etched by exposing the substrate 602 to an etchant 604 according to the patterned photosensitive material 506. For example, in some embodiments, the substrate 602 may comprise a dielectric layer, overlying a semiconductor body, which is exposed to the etchant 604 to form a via hole or a metal trench used to form a metal interconnect layer of an integrated chip. In other embodiments, the substrate 602 may be selectively implanted by implanting the substrate 602 with a dopant species according to the patterned photosensitive material 506.

The patterned photosensitive material 506 may be subsequently removed (i.e., stripped) after the processing of the substrate 602 has been performed. In some embodiments, the patterned photosensitive material 506 may be removed by a dry etching process.

Figure 7A:
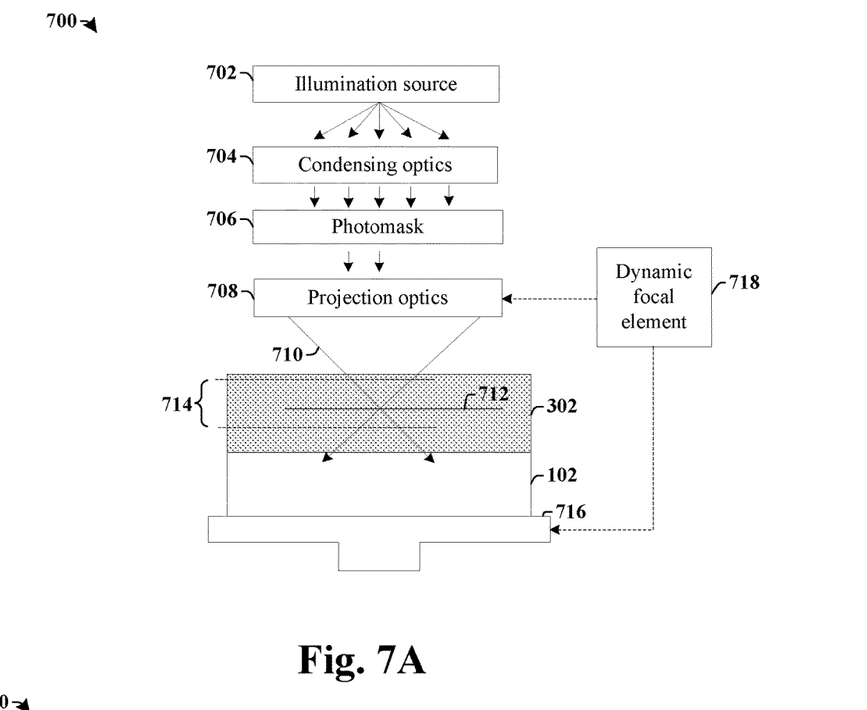
FIGS. 7A-7B illustrate some embodiments of a dynamic lithographic exposure tool configured to expose a photosensitive material over a plurality of depths of focus.

FIG. 7A illustrates a block diagram of some embodiments of a dynamic lithographic exposure tool 700 configured to expose a photosensitive material over a plurality of depths of focus.

The dynamic lithographic exposure tool 700 comprises an illumination source 702 configured to generate electromagnetic radiation. In some embodiments, the illumination source 702 may be configured to generate electromagnetic radiation within the deep ultraviolet region of the electromagnetic spectrum (e.g., approximately 193 nm). In such embodiments, the illumination source 702 may comprise an excimer laser (e.g., comprising a krypton fluoride laser at approximately 248 nm wavelength or an argon fluoride laser at approximately 193 nm wavelength), for example. In other embodiments, the illumination source 702 may be configured to generate electromagnetic radiation within the extreme ultraviolet (EUV) region of the electromagnetic spectrum (e.g., approximately 13.5 nm). In yet other embodiments, the illumination source 702 may be configured to generate electromagnetic radiation in other regions of the electromagnetic spectrum (e.g., radiation having wavelengths of approximately 248 nm, approximately 365 nm, and/or approximately 405 nm).

The electromagnetic radiation generated by the illumination source 702 is provided to condensing optics 704 configured to focus the electromagnetic radiation. In various embodiments, the condensing optics 704 may comprise a first plurality of optical elements, such as lenses, mirrors, filters, etc. The focused radiation is provided from the condensing optics 704 to a photomask 706 configured to selectively transmit electromagnetic radiation to projection optics 708 according to features on the photomask 706. In some embodiments, the photomask 706 may comprise an opaque material arranged over a transparent substrate (e.g., chrome arranged over a glass substrate). In other embodiments, the photomask 706 may comprise a phase shift mask comprising a phase shifting layer (e.g., molybdenum silicon oxy-nitride ($Mo_xSi_yON_z$)) arranged between opaque shielding layer (e.g., chrome) and a transparent substrate. In yet other embodiments, the photomask 706 may comprise an extreme ultraviolet (EUV) mask comprising a patterned absorber arranged over a multi-layer reflective coating disposed on a low thermal expansion material.

The projection optics 708 are configured to focus the electromagnetic radiation 710 along paths that converge along an image plane 712 to project a pattern (defined by features of the photomask 706) within a photosensitive material 302 overlying a substrate 102 held by a wafer stage 716. The image plane 712 has a depth of focus 714 within which the optical properties (e.g., focus, dose, etc.) of the electromagnetic radiation are sufficient to expose the photosensitive material 302 and to form soluble regions within the photosensitive material 302 according to an accepted yield criteria (e.g., the electromagnetic radiation has optical properties that provide for a yield of greater than 90%). In various embodiments, the projection optics 708 may comprise a second plurality of optical elements, such as lenses, mirrors, filters, etc.

A dynamic focal element 718 is configured to vary a location at which the projection optics 708 are focused during exposure of the pattern within the photosensitive material 302. Varying a location at which the projection optics 708 are focused changes a position of the image plane 712 of the projection optics 708. By changing the position of the image plane 712 of the projection optics 708, the photosensitive material 302 is exposed to electromagnetic radiation at multiple depths of focus that respectively span a different region within the photosensitive material 302. By exposing the pattern at multiple depths of focus, electromagnetic radiation 710 having acceptable optical properties provided to a cumulative depth of focus that is larger than a depth of focus of a stationary image plane, thereby improving a process window of the dynamic lithographic exposure tool 700.

Figure 7B:
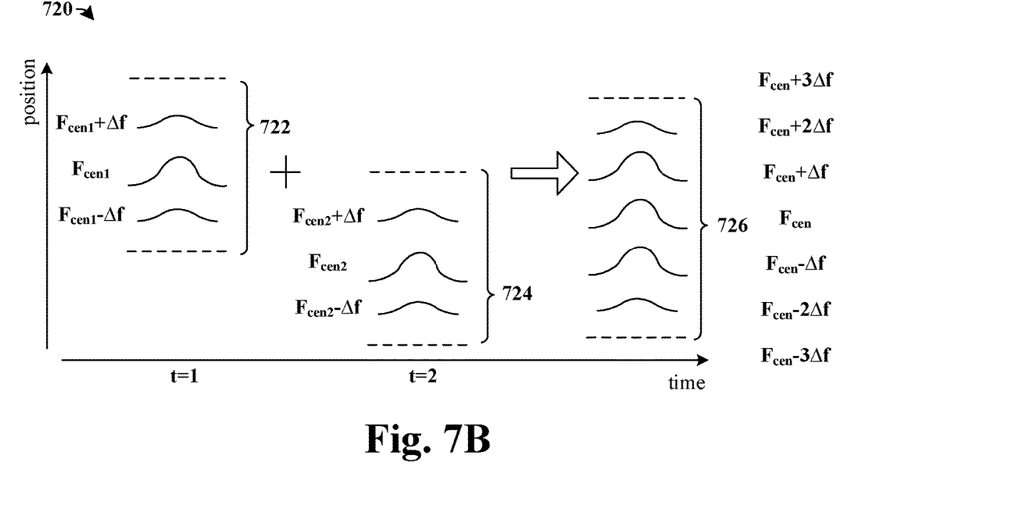

FIG. 7B illustrates some embodiments of a diagram 720 showing exemplary doses for different depths of focus achieved by the disclosed dynamic lithographic exposure tool 700.

As shown in diagram 720, during a first time (t=1) electromagnetic radiation is focused at a first image plane that provides for a first depth of focus 722 spanning a first range of spatial positions. Within the first depth of focus 722, the electromagnetic radiation has a varying dose. For example, within a center of the first depth of focus 722 ($F_{cen1}$), the electromagnetic radiation has a largest dose. However, as the distance from the center of the first depth of focus 722 increases, the dose of the electromagnetic radiation decreases (e.g., the dose at $F_{cen1}+\Delta f$ and $F_{cen1}-\Delta f$ is smaller than the dose at $F_{cen1}$).

During a second time (t=2) electromagnetic radiation is focused at a second image plane that provides for a second depth of focus 724 spanning a second range of spatial positions different than the first range of spatial positions. Within the second depth of focus 724, the electromagnetic radiation also has a varying dose. For example, within a center of the second depth of focus 724 ($F_{cen2}$), the electromagnetic radiation has a largest dose. However, as the distance from the center of the second depth of focus 724 increases, the dose of the electromagnetic radiation decreases (e.g., the dose at $F_{cen2}+\Delta f$ and $F_{cen2}-\Delta f$ is smaller than the dose at $F_{cen2}$).

The cumulative effect of the exposures during the first time (t=1) and the second time (t=2) results in a cumulative depth of focus 726 that provides for improved dose over a larger range of spatial positions. For example, while the electromagnetic radiation at each of the first time (t=1) and the second time (t=2) have depths of focus that extends between $F_{cen}+\Delta f$ and $F_{cen}+\Delta f$, the cumulative depth of focus extends between $F_{cen}+2\Delta f$ and $F_{cen}-2\Delta f$ (wherein $\Delta f$ is a incremental change in focus). Therefore, the dynamic lithographic exposure tool 700 increases the process window from $2\Delta f$ to $4\Delta f$.

Figure 8:
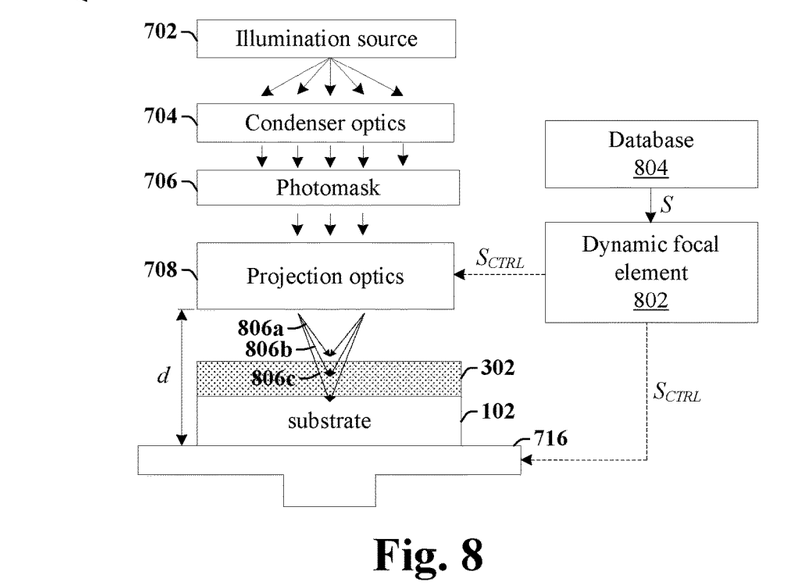
FIG. 8 illustrates a block diagram of some additional embodiments of a dynamic lithographic exposure tool.

FIG. 8 illustrates a block diagram of some additional embodiments of a dynamic lithographic exposure tool 800.

The dynamic lithographic exposure tool 800 comprises a database 804 that is in communication with a dynamic focal element 802. The database 804 may be configured to store information relating to a substrate 102 and/or photosensitive material 302 to be processed, and to provide the information S to the dynamic focal element 802. In various embodiments, the database 804 may store a thickness of the substrate 102, a thickness of a photosensitive material 302 overlying the substrate 102, a minimum feature size to be resolved in the photosensitive material 302, a resolution required to achieve the minimum feature size, a type of photoresist material being used, a distance (d) between the projection optics 708 and a wafer stage 808 configured to hold the substrate 102 (e.g., a vacuum wafer chuck), etc. In some embodiments, the information stored within the database 804 may be determined based upon information from other process tools. For example, the database 804 may receive a thickness of the photosensitive material 302 from a spin coating tool (e.g., based upon a type of photoresist used and one or more speeds used to apply the photoresist onto the substrate 102).

Based upon the information S provided by the database 804, the dynamic focal element 802 is able to determine operational parameters of the dynamic lithographic exposure tool 800. For example, in some embodiments, the dynamic focal element 208 may determine a range over which a focus (e.g., a location of an image plane, a location of a depth of focus, etc.) of the projection optics 708 is to be varied during exposure of the photosensitive material 302 based upon a thickness of the photosensitive material 302 received from the database 804. In other embodiments, the dynamic focal element 208 may determine a rate of change of the focus of the projection optics 708 based upon a type of photosensitive material 302 or desired dose received from the database 804 (so as to provide for a proper dose to the photosensitive material 302). In yet other embodiments, the dynamic focal element 802 may determine a location of an initial image plane of the projection optics 708 (e.g., based upon a thickness of the photosensitive material 302 and the distance (d) between the projection optics 708 and the wafer stage 808 received from the database 804).

The dynamic focal element 802 is subsequently configured to generate a control signal $S_{CTRL}$ based upon the operational parameters. The control signal $S_{CTRL}$ operates the projection optics 708 and/or a wafer stage 716 to dynamically vary a focus of the projection optics 708 during exposure of a pattern within the photosensitive material 302, thereby projecting electromagnetic radiation along a plurality of different paths 806a-806c at different times. The plurality of different paths 806a-806c respectively correspond to image planes having different depths of focus respectively spanning a different region of the photosensitive material 302.

Figure 9:
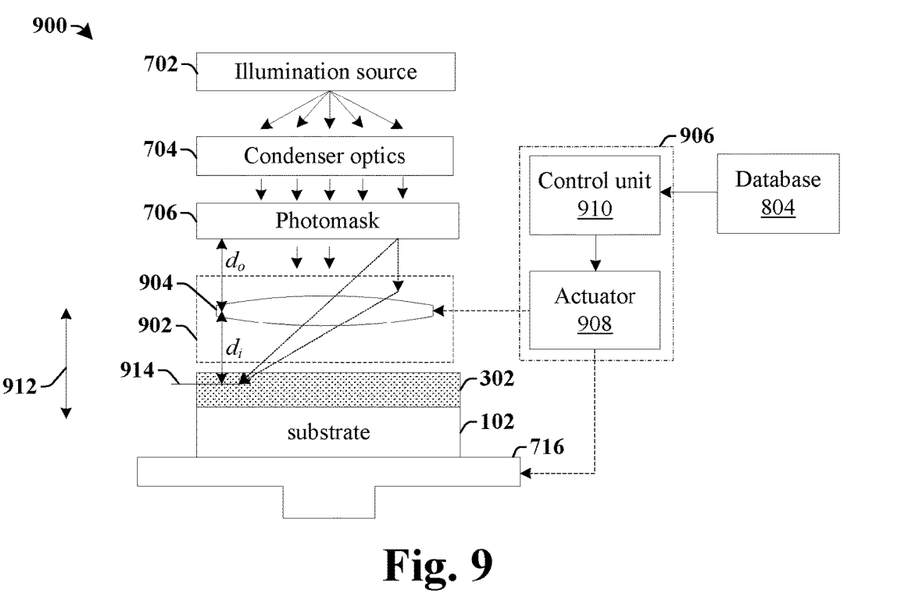
FIG. 9 illustrates a block diagram of some additional embodiments of a dynamic lithographic exposure tool.

FIG. 9 illustrates a block diagram of some additional embodiments of a dynamic lithographic exposure tool 900.

The dynamic lithographic exposure tool 900 comprises a dynamic focal element 906 having an actuator 908 and a control unit 910. The control unit 910 is configured to operate the actuator 908 to change a location of one or more elements of the dynamic lithographic exposure tool 900 to expose a photosensitive material 302 over a substrate 102 at a plurality of depths of focus respectively spanning a different region of the photosensitive material. In some embodiments, the dynamic focal element 906 may be in further communication with a database 804 configured to provide information to the dynamic focal element 906.

In some embodiments, the actuator 908 may be configured to dynamically move a location of a wafer stage 716 holding the substrate 102 during exposure of a photosensitive material 302 over a substrate 102. In such embodiments, the actuator 908 may move the wafer stage 716 along a direction 912 during exposure of the photosensitive material 302. By moving the wafer stage 716 along the direction 912, the image plane 914 (i.e., the plane in which the image of the photomask 706 is projected) and a corresponding depth of focus changes.

In other embodiments, the dynamic lithographic exposure tool 900 may comprise projection optics 902 having an ambulatory projection element 904 configured to focus electromagnetic radiation from photomask 706 onto the photosensitive material 302. In various embodiments, the ambulatory projection element 904 may comprise a lens and/or a mirror. In such embodiments, the dynamic focal element 906 is in communication with the ambulatory projection element 904. The dynamic focal element 906 is configured to change a location of the ambulatory projection element 904 (along direction 912) so as to change a distance between the ambulatory projection element 904 and an object to be projected onto the photosensitive material 302. Changing the location of the ambulatory projection element 904 changes the focus of the projection optics 902.

In some embodiments, the control unit 910 may be configured to operate the actuator 908 to change the location of the ambulatory projection element 904 during exposure of a pattern within the photosensitive material 302. By changing the location of the ambulatory projection element 904, the image plane 914 (i.e., the plane in which the image of the photomask 706 is projected) and a corresponding depth of focus changes. For example, according to the thin lens equation ($1/f=1/d_i+1/d_o$) the distance $d_i$ at which the object plane is formed is equal to $d_i=(f*d_o)/(d_o-f)$. Since the focal length f of an optical component (e.g., a lens) is a constant, the distance $d_i$, at which the image plane 914 is formed can be changed by changing a distance $d_o$ between the object (e.g., the photomask 706 or an image generated from the photomask 706) and the ambulatory projection element 904.

Although the dynamic lithographic exposure tool 900 illustrates the projection optics 902 as comprising a single ambulatory projection element 904, it will be appreciated that the projection optics 902 may comprise multiple optical elements (e.g., lens, mirrors, filters, etc.). Furthermore, while the dynamic lithographic exposure tool 900 is illustrated as changing the depth of focus by varying a location of the ambulatory projection element 904 it will be appreciated that this is not a limiting means of changing the depth of focus and that in alternative embodiments the depth of focus may be changed in alternative ways (e.g., by changing a numerical aperture of the projection optics 902).

Figure 10:
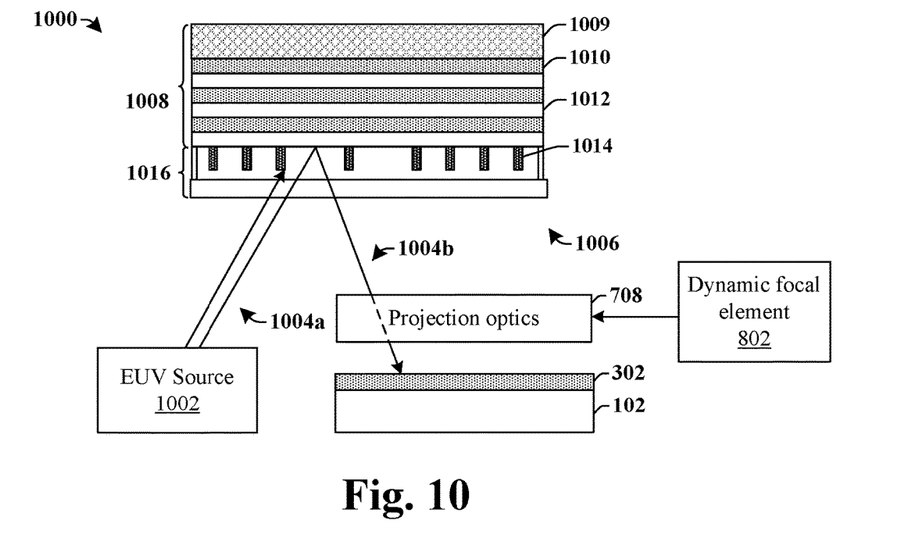
FIG. 10 illustrates a block diagram of some embodiments of a dynamic lithographic exposure tool for an extreme ultraviolet (EUV) lithography system.

FIG. 10 illustrates a block diagram of some embodiments of a dynamic lithographic exposure tool 1000 for an extreme ultraviolet (EUV) lithography system.

The dynamic lithographic exposure tool 1000 comprises an EUV radiation source 1002 configured to emit extreme ultraviolet (EUV) radiation 1004a (e.g., having wavelengths in a range of about 10 nm to about 130 nm). The emitted EUV radiation 1004a is supplied as to an EUV photomask 1006 configured to selectively reflect the EUV radiation 1004a, as reflected EUV radiation 1004b. The reflected EUV radiation 1004b is provided to projection optics 708 configured to focus the reflected EUV radiation 1004b in a manner that selective patterns a photosensitive material 302 disposed over a substrate 102. A dynamic focal element 802 is configured to operate the projection optics 708 to vary a depth of focus of the reflected EUV radiation 1004b during exposure of a pattern on the photosensitive material 302.

In some embodiments, the EUV photomask 1006 comprises a pellicle 1016 mounted on an EUV reticle 1008. The pellicle 1016 comprises a thin film that is configured to prevent contaminant particles from landing on the EUV reticle 1008 and degrading performance of the dynamic lithographic exposure tool 1000. The EUV reticle 1008 comprises a reflective multi-layer reflective coating disposed over a low thermal expansion material (LTEM) 1009. The multi-layer reflective coating comprises plurality of reflective layers 1010 separated by a plurality of spacer layers 1012. A patterned absorber material 1014 configured to absorb (i.e., attenuate) the EUV radiation 1004a is disposed over the multi-layer reflective coating. In some embodiments, a buffer layer (not shown) may be disposed between the multi-layer reflective coating and the patterned absorber material 1014. The buffer layer is configured to act as a capping layer to prevent oxidation of a top one of the reflective layers 1010 by exposure to an ambient environment.

In some embodiments, the reflective layers 1010 may comprise molybdenum (Mo) or ruthenium (Ru) and the spacer layers 1012 may comprise silicon (Si). The reflective layers 1010 are configured to reflect the EUV radiation 1004a by means of Bragg interference between multi-interlayer interference formed between the reflective and spacer layers, 1010 and 1012, respectively. For example, the EUV radiation 1004a may be partially reflected at a first interlayer interface formed between a first reflective layer and a first spacer layer and partially reflected at a second interlayer interface formed between a second reflective layer and a second spacer layer.

Figure 11:
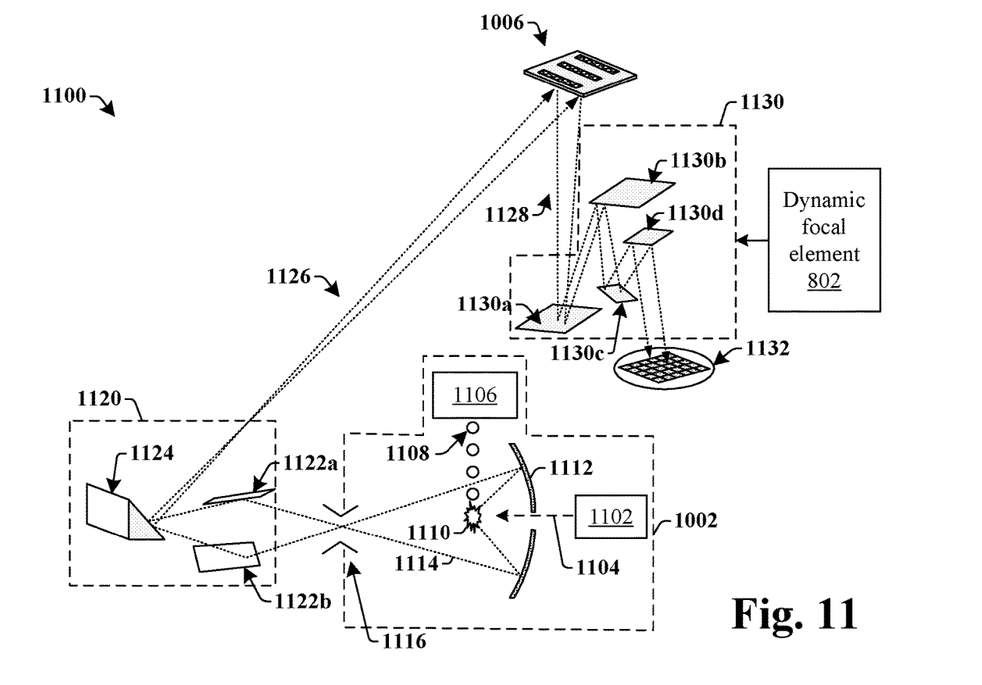
FIG. 11 illustrates a block diagram of some additional embodiments of a dynamic lithographic exposure tool for an EUV lithography system.

FIG. 11 illustrates a block diagram of some additional embodiments of a dynamic lithographic exposure tool 1100 for an EUV lithography system. Although the dynamic lithographic exposure tool 1100 is illustrated as having a certain configuration of components, it will be appreciated that the disclosed EUV radiation source may be implemented in EUV photolithography systems having additional components (e.g., additional mirrors) or having less components (e.g., less mirrors).

The dynamic lithographic exposure tool 1100 comprises an EUV radiation source 1002 configured to supply EUV radiation 1114 (i.e., with a wavelength of between approximately 10 nm and approximately 130 nm) to an EUV photomask 1006 having a patterned multi-layered reflective surface. In some embodiments, the EUV radiation source 1002 may comprise a primary laser 1102, a fuel droplet generator 1106, and a collector mirror 1112. The fuel droplet generator 1106 is configured to provide fuel droplets 1108, which are hit with a primary laser beam 1104 generated by the primary laser 1102. Striking the fuel droplets 1108 with the primary laser beam 1104 generates a plasma 1110 comprising ions that emit EUV radiation 1114 at a wavelength of between approximately 10 nm and approximately 130 nm (e.g., at a wavelength of 13.5 nm).

The EUV radiation 1114 output from the EUV radiation source 1002 is provided to a condensing optics 1120 by way of an intermediate focus unit 1116. In some embodiments, the condensing optics 1120 comprise first and second surfaces, 1122a and 1122b, configured to focus the EUV radiation 1114, and a reflector 1124 configured to reflect the EUV radiation 1126 towards the EUV photomask 1006. The EUV photomask 1006 is configured to selectively reflect the EUV radiation 1128 to projection optics 1130 that project a pattern onto a layer of photosensitive material (e.g., photoresist) disposed over the semiconductor workpiece 1132. To produce the pattern, the EUV photomask 1006 comprises a patterned absorber material arranged on a front surface of the EUV photomask 1006. The patterned absorber material is configured to absorb the EUV radiation 1126, such that the reflected rays of EUV radiation 1128 convey a pattern defined by the EUV photomask 1006.

In some embodiments, the projection optics 1130 may comprise a series of mirrors 1130a-1130d, which serve to reduce a size of the pattern carried by the EUV radiation 1128. The series of mirrors 1130a-1130d convey the EUV radiation 1128 onto the layer of photosensitive material (e.g., photoresist) disposed over the semiconductor workpiece 1132. A dynamic focal element 802 is configured operate upon the projection optics 1130 to vary a depth of focus of the EUV radiation 1128 projected onto the layer of photosensitive material. In some embodiments, the dynamic focal element 802 may be configured to dynamically vary locations of one or more of the mirrors 1130a-1130d. The EUV radiation 1128 patterns the layer of photosensitive material so that subsequent processing can be performed on selected regions of the semiconductor workpiece 1132.

Therefore, the present disclosure relates to a dynamic lithographic exposure method, and an associated apparatus, which changes a focus of electromagnetic radiation during exposure of a photosensitive material to cause the electromagnetic radiation to have a plurality of different depths of focus that respectively span a different region of the photosensitive material. The different depths of focus provide for a cumulative depth of focus that is larger than the individual different depths of focus, and therefore results in a larger lithographic process window that improves exposure of the photosensitive material.

In some embodiments, the present disclosure relates to a method of developing a photosensitive material. The method comprises forming a photosensitive material over a substrate. The method further comprises exposing the photosensitive material to electromagnetic radiation at a plurality of depths of focus that respectively span a different region within the photosensitive material. Exposing the photosensitive material to the electromagnetic radiation modifies a solubility of an exposed region within the photosensitive material. The method further comprises developing the photosensitive material to remove the soluble region.

In other embodiments, the present disclosure relates to a method of developing a photosensitive material. The method comprises forming a photosensitive material over a substrate. The method further comprises focusing electromagnetic radiation on a first image plane at a first time. The first image plane is located at a first depth below an upper surface of the photosensitive material. The method further comprises focusing the electromagnetic radiation on a second image plane at a second time. The second image plane is located at a second depth below the upper surface of the photosensitive material. Exposing the photosensitive material to the electromagnetic radiation modifies a solubility of an exposed region of the photosensitive material.

In yet other embodiments, the present disclosure relates to a photolithography tool. The photolithography tool comprises an illumination source configured to generate electromagnetic radiation. Projection optics are configured to focus the electromagnetic radiation onto a photosensitive material overlying a substrate according to a pattern on a photomask. A dynamic focal element is configured to dynamically change a focus of the projection optics during exposure of the photosensitive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of developing a photosensitive material, comprising:
    forming a photosensitive material over a substrate;
    exposing the photosensitive material to electromagnetic radiation at a plurality of depths of focus that are respectively smaller than a thickness of the photosensitive material and that respectively span a different region within the photosensitive material, wherein exposing the photosensitive material to the electromagnetic radiation modifies a solubility of an exposed region within the photosensitive material; and
    developing the photosensitive material to remove a soluble region.

2. The method of claim 1, wherein exposing the photosensitive material at the plurality of depths of focus comprises continuously exposing the photosensitive material to the electromagnetic radiation while moving the substrate, wherein the plurality of depths of focus are substantially aligned along a vertical direction that is normal to an upper surface of the photosensitive material.

3. The method of claim 2,
    wherein the plurality of depths of focus comprise a first depth of focus having a greatest dose at a center of the first depth of focus, and a second depth of focus having a greatest dose at a center of the second depth of focus; and
    wherein the first depth of focus and the second depth of focus provide for a collective depth of focus having a collective dose that is greatest at a point that is vertically between the center of the first depth of focus and the center of the second depth of focus.

4. The method of claim 1, further comprising:
    operating an actuator to change a position of a projection optics during exposure of a same pattern within the photosensitive material, wherein the projection optics are located between a photomask and the substrate.

5. The method of claim 4, further comprising:
    focusing the electromagnetic radiation on a first image plane at a first time, wherein the first image plane is located at a first depth below an upper surface of the photosensitive material; and
    focusing the electromagnetic radiation on a second image plane at a second time, wherein the second image plane is located at a second depth below the upper surface of the photosensitive material.

6. The method of claim 5, wherein images formed on the first image plane and the second image plane are offset in a vertical direction and substantially aligned along a lateral direction.

7. The method of claim 1, wherein the photosensitive material is arranged over a substantially flat upper surface of the substrate that extends between outermost sidewalls of the substrate.

8. The method of claim 4, further comprising:
    determining the thickness of the photosensitive material;
    determining a minimum feature size to be exposed; and
    determining a range over which a focus of the electromagnetic radiation is changed based upon the thickness or the minimum feature size.

9. The method of claim 1, further comprising:
    continuously exposing the photosensitive material to electromagnetic radiation in a same pattern while dynamically changing the depth of focus of the electromagnetic radiation.

10. The method of claim 1, further comprising:
    discretely exposing the photosensitive material to electromagnetic radiation in a same pattern between changing the depth of focus of the electromagnetic radiation.

11. The method of claim 1, further comprising:
    processing the substrate after removing the soluble region; and
    removing the photosensitive material from the substrate after processing the substrate.

12. The method of claim 11, further comprising:
    forming a second layer of photosensitive material over the substrate after removing the photosensitive material;
    exposing the second layer of photosensitive material to the electromagnetic radiation at a second plurality of depths of focus that respectively span a different spatial region within the second layer of photosensitive material, wherein exposing the second layer of photosensitive material to the electromagnetic radiation forms a second soluble region within the second layer of photosensitive material having a different pattern than the soluble region; and
    developing the second layer of photosensitive material to remove the second soluble region.

13. A method of developing a photosensitive material, comprising:
    forming a photosensitive material over a substrate;
    focusing electromagnetic radiation on a first image plane at a first time, wherein the first image plane is located at a first depth below an upper surface of the photosensitive material and has a first depth of focus;
    focusing the electromagnetic radiation on a second image plane at a second time, wherein the second image plane is located at a second depth below the upper surface of the photosensitive material and has a second depth of focus; and
    wherein exposing the photosensitive material to the electromagnetic radiation modifies a solubility of an exposed region of the photosensitive material, wherein the second depth of focus vertically extends to a center of the first depth of focus.

14. The method of claim 13, further comprising:
    focusing the electromagnetic radiation on the first image plane at the first time along a first path that converges at a first point; and
    focusing the electromagnetic radiation on the second image plane at the second time along a second path that converges at a second point that is directly above the first point.

15. The method of claim 14, wherein the first depth of focus and the second depth of focus are respectively smaller than a thickness of the photosensitive material, and wherein the first depth of focus and the second depth of focus collectively define a collective depth of focus is larger than the thickness of the photosensitive material.

16. The method of claim 13, further comprising:
removing the photosensitive material from the substrate;
forming a second layer of photosensitive material over the substrate after removing the photosensitive material; and
exposing the second layer of photosensitive material to the electromagnetic radiation at a second plurality of depths of focus that respectively span a different spatial region within the second layer of photosensitive material, wherein exposing the second layer of photosensitive material to the electromagnetic radiation modifies a solubility of a second region within the second layer of photosensitive material having a different pattern than the exposed region.

17. A method of performing a photolithography process, comprising:
forming a photosensitive material over a substrate;
providing electromagnetic radiation to the photosensitive material over a first depth of focus at a first time to expose a pattern within the photosensitive material;
providing the electromagnetic radiation to the photosensitive material over a second depth of focus at a second time to expose the pattern within the photosensitive material, wherein the first depth of focus and the second depth of focus define a collective depth of focus having a dose that is greatest at a point that is vertically between a center of the first depth of focus and a center of the second depth of focus; and
removing a part of the photosensitive material after the second time.

18. The method of claim 17, further comprising:
changing a focus of the electromagnetic radiation provided to the photosensitive material over time, so as to monotonically change a position of an image plane of the electromagnetic radiation relative to an upper surface of the photosensitive material.

19. The method of claim 17,
wherein the first depth of focus spans a first range of spatial positions below an upper surface of the photosensitive material; and
wherein the second depth of focus spans a second range of spatial positions below the upper surface of the photosensitive material that is different than the first range of spatial positions.

20. The method of claim 17, further comprising:
generating a control signal based upon one or more operational parameters;
providing the control signal to a dynamic focal element that is configured to operate upon projection optics to dynamically vary a focus of the projection optics; and
wherein the one or more operational parameters include a rate of change of the focus of the projection optics.

* * * * *